US011962128B2

(12) United States Patent
Nam et al.

(10) Patent No.: US 11,962,128 B2
(45) Date of Patent: Apr. 16, 2024

(54) OPTICAL DEVICE AND METHOD OF FORMING THE SAME

(71) Applicant: Nanyang Technological University, Singapore (SG)

(72) Inventors: Donguk Nam, Singapore (SG); Youngmin Kim, Singapore (SG); Yongduck Jung, Singapore (SG); Daniel Burt, Singapore (SG); Hyo Jun Joo, Singapore (SG); Weijun Fan, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 18/260,739

(22) PCT Filed: Mar. 7, 2022

(86) PCT No.: PCT/SG2022/050116
§ 371 (c)(1),
(2) Date: Jul. 7, 2023

(87) PCT Pub. No.: WO2022/191774
PCT Pub. Date: Sep. 15, 2022

(65) Prior Publication Data
US 2024/0088628 A1    Mar. 14, 2024

(30) Foreign Application Priority Data

Mar. 8, 2021  (SG) ............................ 10202102315V (51) Int. Cl.
*H01S 5/30*    (2006.01)
*H01S 5/042*   (2006.01)
(Continued)

(52) U.S. Cl.
CPC .......... *H01S 5/3427* (2013.01); *H01S 5/0424* (2013.01); *H01S 5/04257* (2019.08);
(Continued)

(58) Field of Classification Search
CPC ......... H01S 5/06; H01S 5/0607; H01S 5/3403
See application file for complete search history.

(56) References Cited

U.S. PATENT DOCUMENTS 9,065,253 B2 *   6/2015   Anantram ............. H01S 5/0607
2015/0372455 A1  12/2015  Nam et al.
(Continued)

FOREIGN PATENT DOCUMENTS

WO    2009017856 A2    2/2009

OTHER PUBLICATIONS

Chrétien, Jérémie, et al., "GeSn Lasers Covering a Wide Wavelength Range Thanks to Uniaxial Tensile Strain", ACS Photonics 2019, 6, 2462-2469.
(Continued)

*Primary Examiner* — Xinning(Tom) Niu
*Assistant Examiner* — Delma R Fordé
(74) *Attorney, Agent, or Firm* — Botos Churchill IP Law LLP (57) ABSTRACT

According to embodiments of the present invention, an optical device is provided. The optical device includes a substrate, a semiconductor layer on the substrate, the semiconductor layer having a beam structure that is subjected to a tensile strain, wherein the beam structure includes a plurality of nanostructures, and wherein, for each nanostructure of the plurality of nanostructures, the nanostructure is configured to locally amplify the tensile strain at the nanostructure to define a strain-induced artificial quantum heterostructure for quantum confinement. According to a further
(Continued)

ther embodiment of the present invention, a method of forming an optical device is also provided.

20 Claims, 6 Drawing Sheets (51) Int. Cl.
H01S 5/125 (2006.01)
H01S 5/34 (2006.01)
(52) U.S. Cl.
CPC .......... H01S 5/125 (2013.01); H01S 5/3054 (2013.01); H01S 5/3403 (2013.01)

(56) References Cited

U.S. PATENT DOCUMENTS

2019/0044308 A1* 2/2019 Reboud .............. B81C 1/00158
2020/0358254 A1 11/2020 Reboud et al.

OTHER PUBLICATIONS

Elbaz, A., et al., "Germanium microlasers on metallic pedestals", APL Photonics 3, 106102 (2018), https://doi.org/10.1063/1.5025705, 10 pp.

Elbaz Anas, et al., "Ultra-low-threshold continuous-wave and pulsed lasing in tensile-strained GeSn alloys", Nature Photonics, vol. 14, Jun. 2020, https://doi.org/10.1038/s41566-020-0601-5, pp. 375-382.

Pilon, F.T. Armand, et al., "Lasing in strained germanium microbridges", Nature Communications, (2019) 10:2724 | https://doi.org/10.1038/s41467-019-10655-6, 8 pages.

Bao, Shuyu, et al., "Low-threshold optically pumped lasing in highly strained germanium nanowires", Nature Communications, vol. 8, Article No. 1845, Nov. 29, 2017, 7 pp.

Phan, Hoang-Phuong, et al., "Ultra-high strain in epitaxial silicon carbide nanostructures utilizing residual stress amplification", Appl. Phys. Lett., 2017, vol. 110, 141906, 5 pp.

* cited by examiner

OPTICAL DEVICE AND METHOD OF FORMING THE SAME

CROSS-REFERENCE TO RELATED APPLICATION

The present application is a national phase entry under 35 U.S.C. § 371 of International Application No. PCT/SG2022/050116 filed Mar. 7, 2022 published in English, which claims priority from Singapore patent application no. 10202102315V filed Mar. 8, 2021, all of which are incorporated herein by reference.

TECHNICAL FIELD

Various embodiments relate to an optical device and a method of forming an optical device.

BACKGROUND

Since their first introduction over half a century ago, quantum heterostructures (e.g., quantum wells, wires, and dots) have been the most vital part in a myriad of optoelectronic devices such as lasers and solar cells. Particularly for electrically-driven laser applications, quantum heterostructures are indispensable because the population inversion—the necessary condition for lasing—is fundamentally impossible to realise without quantum heterostructures.

Tensile strained Ge (germanium) and GeSn (germanium-tin) lasers have been arguably one of the most promising candidates for silicon-compatible on-chip light sources. Large tensile strain (>4.6% uniaxial strain) can transform germanium's inherent bandstructure to direct bandgap so that germanium can become a suitable material for laser applications. When combined with Sn alloying, the required tensile strain for achieving direct bandgap in GeSn can be significantly lowered (e.g., ~2% uniaxial strain for GeSn with 4% Sn content). The next step towards the realisation of practical on-chip Ge and GeSn lasers is to add the last major functionality that is electrical injection.

Some technologies used in the field of strain-engineered Ge lasers have demonstrated that the application of tensile strain in a bulk Ge layer can lead to the creation of Ge lasers. However, these technologies have the disadvantage that they cannot exploit quantum heterostructures.

Some technologies used in the field of strain-engineered GeSn lasers have demonstrated that the application of tensile strain to GeSn layers can successfully convert the indirect bandgap to direct bandgap, resulting in a low-threshold lasing. However, these technologies have the disadvantage that they rely on bulk GeSn layers and that integration of quantum heterostructures in the structures is very challenging.

SUMMARY

The invention is defined in the independent claims. Further embodiments of the invention are defined in the dependent claims.

According to an embodiment, an optical device is provided. The optical device may include a substrate, a semiconductor layer on the substrate, the semiconductor layer having a beam structure that is subjected to a tensile strain, wherein the beam structure includes a plurality of nanostructures, and wherein, for each nanostructure of the plurality of nanostructures, the nanostructure is configured to locally amplify the tensile strain at the nanostructure to define a strain-induced artificial quantum heterostructure for quantum confinement.

According to an embodiment, a method of forming an optical device is provided. The method may include forming a semiconductor layer on a substrate, and forming a beam structure in the semiconductor layer, the beam structure being subjected to a tensile strain, wherein the beam structure includes a plurality of nanostructures, and wherein, for each nanostructure of the plurality of nanostructures, the nanostructure is configured to locally amplify the tensile strain at the nanostructure to define a strain-induced artificial quantum heterostructure for quantum confinement.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 2A shows a schematic view of an electrically-pumped germanium nanolaser, with artificial quantum heterostructures, of various embodiments, while FIG. 2B shows a zoomed in view of the artificial quantum heterostructures of FIG. 2A.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the phrase "at least substantially" may include "exactly" and a reasonable variance.

In the context of various embodiments, the term "about" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments may relate to artificial low-dimensional Ge (germanium) and GeSn (germanium-tin) lasers enabled by on-demand quantum strain engineering.

Compared to known techniques, various embodiments may include one or more of the following: (1) a high-Q optical cavity, (2) electrical pumping, and (3) a quantum gain medium.

Using a strain amplification technique, direct bandgap germanium as well as optically-pumped lasing in strained germanium at orders-of-magnitude smaller lasing threshold (3 kW/cm$^2$) compared to known silicon-compatible lasers have been achieved by the inventors. Lasing in strain-engineered GeSn layers has also been achieved by the inventors.

The next step towards the realisation of practical on-chip Ge and GeSn lasers is to add the functionality of electrical injection. Despite their potential roles in laser applications, quantum heterostructures have rarely been employed in the field of known germanium-based laser research, thus inhibiting any observation of an efficient electrically-pumped lasing on silicon thus far. While quantum heterostructures are helpful in creating electrically pumped Ge and GeSn, it is challenging to create quantum heterostructures with tensile strained Ge and GeSn active regions using known epitaxy methods. This is because most of the possible choices of materials for the barrier region of heterostructures having larger bandgaps than Ge (e.g., silicon) and GeSn (e.g., GeSn with lower Sn content) possess smaller lattice constants than Ge and GeSn, thereby inducing a 'harmful' compressive strain which negates any 'useful' mechanical tensile strain.

In various embodiments, optical devices, for example, lasers, can employ or exploit one or more (quantum) heterostructures for carrier confinement in electrical pumping to make the laser sufficiently efficient for practical applications. Further, quantum heterostructures enable extremely low thresholds, which are required for the intended applications of lasers such as Ge lasers.

The techniques disclosed herein may create an array or plurality of deep (artificial) quantum wells in a single material or material composition which not only confine electrical charge carriers at room temperature but may also possess 'quantised' energy levels for quantum confinement effect. Quantum confinement may reduce the threshold current density and make the associated optical device (e.g., laser) much more efficient and, therefore, practically viable. This is because the density of states function of electrons in the quantum well system has an abrupt edge that concentrates electrons in energy states that contribute, e.g., to laser action. In various embodiments, quantum wells may be generated based on nanostructures, e.g., nanoholes. Each nanohole may produce two artificial quantum wells. The strain amplification which produces the artificial quantum heterostructure is concentrated perpendicular to the plane of the tensile strain at the extremities of each nanohole (above and below the hole).

Although there have been a few successful demonstrations on the creation of strain-induced potential wells in Ge, the created potential wells were either very shallow due to small tensile strain or large in size, thereby inhibiting the observation of room-temperature quantum confinement effect. The techniques disclosed herein may enable nanoscale (e.g., <10 nm) quantum wells with a well depth of ~200 meV, which may induce a significant quantisation between energy levels (e.g., >50 meV quantization between two lowest energy states). Well depth refers to the energy barrier that confines the carriers and introduces quantum confinement effects. A substantial enhancement of optical gain in germanium artificial quantum heterostructures may be expected, which may allow the performance of Ge and GeSn lasers to be pushed to or close(r) to the limit. The presence of nanostructures that may be used to create quantum heterostructures may or does not prevent the realisation of a high-Q (high-quality factor) optical cavity that allows the creation of lasing. Electrically-pumped room-temperature Ge and GeSn nanolasers with artificial low-dimensional gain media may present a timely opportunity for scientific breakthrough and engineering development.

The techniques disclosed herein provide a platform to achieve one or more strain-induced (artificial) quantum heterostructures that can be integrated with a high-Q optical cavity and electrical pumping scheme for realising Ge and GeSn lasers with a quantum gain medium. Such a platform may enable realisation of room-temperature electrically pumped Ge and GeSn lasers operating at a low threshold.

The artificial quantum heterostructures of various embodiments are distinguished from known heterostructures (including quantum structures) and known "non-artificial" epitaxially grown quantum heterostructures. As compared to such known heterostructures employing two different materials having different bandgaps (based on known heteroepitaxy approach), the artificial quantum heterostructures are defined in one material or material composition (i.e., the artificial quantum heterostructures involve only one material (composition)) to achieve a similar effect of different bandgaps using strain gradients. Therefore, the heterostructures in various embodiments are "artificial" quantum heterostructures because strain gradients are employed to define the heterostructures and not two different materials to define the heterostructures that are achieved in known methods. A higher strain leads to a smaller or narrower bandgap. A region with a higher strain being sandwiched by two regions of lower strain leads to a region having a smaller bandgap sandwiched by regions of a larger bandgap. The types of artificial quantum heterostructures that may be used in the techniques disclosed herein may be or may include quantum wells. The presence of artificial quantum heterostructures in various embodiments lead to lower threshold device operation.

The artificial quantum heterostructures are under strain and also defined by strain. Known quantum heterostructures are two different materials with larger/smaller bandgaps, respectively. In the techniques disclosed herein, artificial heterostructures are defined in one material or material composition (e.g., Ge) by using nanoscale strain gradients. This enables the introduction of quantum confinement without the complex epitaxial growth used in known methods and also may allow tuning of the properties by changing the design.

The techniques disclosed herein may provide one or more of the following features: (1) capability to create deep (>200 meV) and narrow (<10 nm) quantum wells, (2) ability to integrate a high-Q optical cavity, and (3) ability to integrate electrical contacts for electrically pumped lasers. As a non-limiting example, the optical cavity may be defined by a pair of distributed Bragg reflectors (DBRs). The Q-factor that may be achieved is high, for example, at around 2000. This may be further improved with surface passivation and/or optimisation of the fabrication process.

Figure 1A:
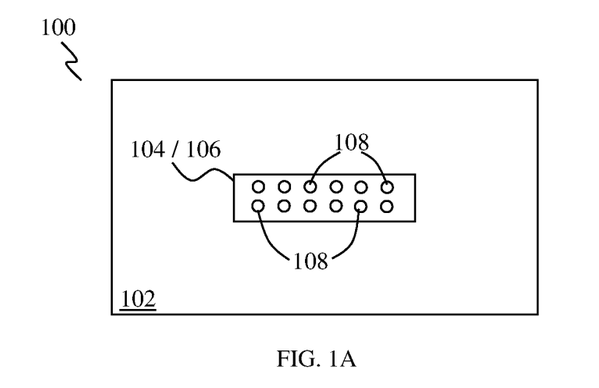
FIG. 1A shows a simplistic top view of an optical device, according to various embodiments.

FIG. 1A shows a simplistic top view of an optical device 100, according to various embodiments. The optical device 100 includes a substrate 102, a semiconductor layer 104 on the substrate 102, the semiconductor layer 104 having a beam structure 106 that is subjected to a tensile strain, wherein the beam structure 106 includes a plurality of nanostructures (four nanostructures are indicated as 108), and wherein, for each nanostructure 108 of the plurality of nanostructures 108, the nanostructure 108 is configured to locally amplify the tensile strain at the nanostructure 108 to define a strain-induced artificial quantum heterostructure for quantum confinement.

In other words, an optical device 100 is provided, having a substrate or substrate arrangement 102, and a semiconductor layer 104 formed on or over the substrate 102. A beam structure 106 is defined or formed in the semiconductor layer 104, where a plurality of nanostructures 108 are formed or defined in or on the beam structure 106. The beam structure 106 is under or experiencing a tensile strain. In other words, the beam structure 106 is tensile strained. The beam structure 106 may experience a uniaxial tensile strain, e.g., directed along a longitudinal axis of the beam structure 106. The nanostructures 108, being part of the beam structure 106, are also tensile strained, or under or subjected to the tensile strain.

Each nanostructure 108 of the plurality of nanostructures 108 is configured to locally amplify the tensile strain at the nanostructure 108 to define or generate a (tensile) strain-induced artificial quantum heterostructure in the beam structure 106 for (or to induce) quantum confinement (effect). This means that there is increased tensile strain at or around or in the vicinity of one or more defined local regions (or local volumes) of each nanostructure 108 compared to the tensile strain experienced at, for example, (neighbouring) regions or areas of the nanostructure 108 outside of the local region(s) or volume(s) of increased tensile strain. In this way, there may be enhanced localised strain at each nanostructure 108, or at one or more local regions or volumes of the nanostructure 108. The tensile strain may be concentrated or amplified at or towards the top and bottom regions of the nanostructures 108. Strain may be concentrated or amplified at local regions or volumes on opposite sides of each nanostructure 108. The strain amplification may be concentrated perpendicular to the plane of the tensile strain at the extremities of nanostructure 108, at the top and bottom surfaces of the semiconductor layer 104, and extending therebetween. The local region(s) or volume(s) of increased or amplified tensile strain extends continuously throughout the thickness of the semiconductor layer 104 from the top surface to the bottom surface of the semiconductor layer 104.

The amplified strain at each local region of each nanostructure 108 gives rise to a tensile strain gradient, resulting in an artificial quantum heterostructure and tensile strain-induced quantum confinement (effect). The strain gradient (i.e., variation in the amount of tensile strain) induced by the nanostructures 108 in the beam structure 106 leads to a variation in the material bandgap across different regions or localities, thus resulting in artificial quantum heterostructures that are defined by regions of different strains. This is in contrast to known quantum heterostructures or non-artificial quantum heterostructures which are defined by regions or layers of materials of different compositions with different bandgaps (e.g., a first region having a material of a first composition being sandwiched, on opposite sides of the first region, by second regions having a material of a second composition) where non-artificial quantum heterostructures are defined by a compositional gradient leading to composition-induced quantum confinement. In this way, non-artificial heterostructures are defined using different materials (i.e., hetero) whereas the artificial heterostructures of various embodiments occur in the same material or material composition.

Each nanostructure 108 may define at least one strain-induced artificial quantum heterostructure. Each nanostructure 108 may define two strain-induced artificial quantum heterostructures.

Each artificial quantum heterostructure may include or may define a quantum well.

The plurality of nanostructures 108 may be defined in a semiconductor material of a single composition (e.g., elemental germanium (Ge), or germanium-tin (GeSn)). Therefore, the semiconductor layer 104 may include or may be made of a semiconductor material of a single composition.

The plurality of nanostructures 108 may be spaced apart from each other. The spacing may be at least substantially uniform.

The plurality of nanostructures 108 may be arranged in rows and columns, e.g., in a grid arrangement.

In various embodiments, the semiconductor layer 104 has an intrinsic or initial tensile strain. Such strain may be a result of the semiconductor layer 104 being formed on the substrate 102, for example, as a result of a mismatch between characteristics or parameters associated with the substrate 102 and the semiconductor layer 104, e.g., a difference in their respective thermal expansion coefficients. The tensile strain acting on the beam structure 106 may be the initial tensile strain or may be increased relative to the initial tensile strain as a result of additional processing.

In various embodiments, the optical device 100 may allow for light to propagate through the beam structure 106 or the optical device 100. Light may propagate in a direction at least substantially parallel to the semiconductor layer 104 or the beam structure 106, for example, at least substantially parallel to a major surface of the semiconductor layer 104.

The beam structure 106, having the plurality of nanostructures 108 resulting in artificial quantum heterostructures, may define an active region. The beam structure 106, having the plurality of nanostructures 108 resulting in artificial quantum heterostructures, may define a gain medium. A gain medium is a source of optical gain that allows light amplification. The beam structure 106, being tensile strained and having the plurality of nanostructures 108, may provide or enhance the optical gain of the optical device 100. The artificial quantum heterostructures are strained, which improves the directness of the band structure whilst simultaneously introducing quantum confinement effects which may substantially improve the gain. Therefore, light propagating through the beam structure 106 may experience gain or may be amplified.

In the context of various embodiments, the beam structure 106 may have a length between about 0.5 μm and about 50 μm, for example, between about 0.5 μm and about 30 μm, between about 0.5 μm and about 10 μm, between about 0.5 μm and about 5 μm, between about 5 μm and about 50 μm, between about 5 μm and about 30 μm, between about 5 μm and about 10 μm, between about 2 μm and about 20 μm, or between about 10 μm and about 30 μm.

In the context of various embodiments, the beam structure 106 may have a width between about 0.05 μm and about 2 μm, for example, between about 0.05 μm and about 1 μm, between about 0.05 μm and about 0.5 μm, between about 0.05 μm and about 0.2 μm, between about 0.2 μm and about 2 μm, between about 0.2 μm and about 1 μm, between about 0.2 μm and about 0.5 μm, or between about 0.5 μm and about 1 μm.

The beam structure 106 may have a thickness that is determined by the thickness of the semiconductor layer 104.

In the context of various embodiments, the thickness of the semiconductor layer 104 may be between about 1 nm and about 5000 nm (i.e., 5 μm), e.g., between about 1 nm and about 3000 nm, between about 1 nm and about 1000 nm, between about 1 nm and about 500 nm, between about 1 nm and about 100 nm, between about 100 nm and about 5000 nm, between about 1000 nm and about 5000 nm, between about 3000 nm and about 5000 nm, between about 100 nm and about 1000 nm, between about 500 nm and about 2000 nm, or between about 2000 nm and about 4000 nm.

In various embodiments, a period of the plurality of nanostructures 108 may be between about 50 nm and about 150 nm, for example, between about 50 nm and about 100 nm, between about 50 nm and about 80 nm, between about 80 nm and about 150 nm, between about 100 nm and about 150 nm, or between about 70 nm and about 120 nm. The smaller the period, the more nanostructures may be provided or placed.

In various embodiments, a number of the plurality of nanostructures 108 may be between 1 and 1000, for example, between 1 and 500, between 1 and 200, between 200 and 1000, between 500 and 1000, between 100 and 1000, between 100 and 500, between 100 and 200, between 200 and 800, or between 300 and 500. The range or the number of the plurality of nanostructures 108 provided may depend on the geometry of the beam structure 106/bridge structure. For example, the range or the number of the plurality of nanostructures 108 may depend on the size of the beam structure 106, where a larger beam structure 106 may accommodate more nanostructures 108 which increase the effective gain medium.

Each nanostructure 108 of the plurality of nanostructures 108 may be or may include or may be defined by a nanohole. The nanoholes may be defined or etched through the beam structure 106, or, effectively the semiconductor layer 104. The nanoholes may be etched entirely (i.e., all the way) through the semiconductor layer 104. Each nanohole may have a depth that is the same as the thickness of the semiconductor layer 104. Each nanostructure (e.g., nanohole) may have a dimension (or diameter) between about 1 nm and about 100 nm, for example, between about 1 nm and about 50 nm, between about 50 nm and about 100 nm, or between about 20 nm and about 80 nm. It should be appreciated that other types of nanostructures 108 may be employed, including but not limited to, nano-squares to make even smaller strain gradients (at the corners of the nano-squares), nano-triangles, and nano-rectangles.

The plurality of nanostructures (e.g., nanoholes) 108 may have a shape including but not limited to a square, a diamond or a circle. Nevertheless, it should be appreciated that other suitable shapes may be employed.

In various embodiments, each nanohole may have a diameter of about 50 nm or less (i.e., ≤50 nm), for example, ≤40 nm, ≤30 nm, ≤20 nm, ≤10 nm, or ≤5 nm Without wishing to be bound by any theory, a 50 nm diameter nanohole may allow 25 nm strain gradients in the hole which is the length at which quantum confinement may start to become strong.

The optical device 100 may further include an optical cavity optically coupled to the beam structure 106. The beam structure 106, with the plurality of nanostructures 108, may be located within the optical cavity. The optical cavity may be defined in or using the semiconductor layer 104. The optical cavity may provide light confinement. The optical cavity may confine light or the associated optical field (or optical mode) within the beam structure 106 or the optical device 100. For example, the optical cavity may confine light propagating through or along the beam structure 106. The light confined by the optical cavity may propagate back and forth, through the beam structure 106.

The optical cavity may be defined by a pair of distributed Bragg reflectors (DBRs), wherein the beam structure 106 may be arranged between the pair of DBRs. This means that the beam structure 106 may be arranged between a first DBR and a second DBR. The pair of DBRs may be arranged at opposite end regions (or ends) of the beam structure 106. Each DBR may be or may act as a mirror. The pair of DBRs may serve to reflect light effectively towards the beam structure 106 to confine the light. Each DBR (or the parameter(s) thereof) may be designed to correspond to the wavelength of the light to be confined.

The pair of DBRs may be embedded in the semiconductor layer 104. The semiconductor layer 104 may be patterned to define the pair of DBRs.

Light may propagate in a direction at least substantially parallel to the semiconductor layer 104 or the beam structure 106, for example, at least substantially parallel to a major surface of the semiconductor layer 104, within the optical cavity or in between the pair of DBRs.

Each DBR of the pair of DBRs may have a curvature that is curved away from the beam structure 106. The curvature may be designed to match the distribution of the light, which diverges in a direction away from the beam structure 106 as it propagates, at the DBR to minimise optical loss.

For each DBR of the pair of DBRs, a plurality of air trenches may be defined in the DBR, wherein a number of the plurality of air trenches may be between 8 and 12, for example, between 8 and 10, or between 10 and 12. Accordingly, each DBR may include a sequence of air and the semiconductor layer material arranged alternately. In other words, each DBR may have a structure having alternating air trenches and semiconductor layer material. Air and the material of the semiconductor layer have different refractive indices such that light may be reflected at the interface thereof due to such difference.

In various embodiments, a width of each air trench of the plurality of air trenches may be between about 50 nm and about 300 nm, for example, between about 50 nm and about 200 nm, between about 50 nm and about 100 nm, between about 100 nm and about 300 nm, between about 200 nm and about 300 nm, or between about 100 nm and about 200 nm.

In various embodiments, a period of the plurality of air trenches may be between about 200 nm and about 400 nm, for example, between about 200 nm and about 300 nm, between about 200 nm and about 250 nm, between about 250 nm and about 400 nm, between about 300 nm and about 400 nm, or between about 250 nm and about 350 nm.

In various embodiments, the distance between the beam structure 106 and each DBR of the pair of DBRs may be between about 1 µm and about 30 µm to confine the optical mode, for example, between about 1 µm and about 20 µm, between about 1 µm and about 10 µm, between about 1 µm and about 5 µm, between about 10 µm and about 30 µm, between about 20 µm and about 30 µm, between about 5 µm and about 10 µm, or between about 5 µm and about 20 µm.

In various embodiments, the semiconductor layer 104 may include a p-i-n junction having a p-doped region (or p-region), an intrinsic region (or i-region) and an n-doped region (or n-region), wherein the intrinsic region includes the beam structure 106. In other words, the beam structure 106 may be formed or defined in the i-region. The i-region, including the beam structure 106, may define an active region or a gain medium. Having a p-i-n junction allows for an electrical pumping scheme, where the optical device 100 may be electrically pumped. Having a p-i-n junction facilitates electrical injection of carriers, where holes are injected from the p-doped region and electrons are injected from the n-doped region to the intrinsic region having the beam structure 106. The p-i-n junction may be planar.

The p-i-n junction may be formed via ion implantation. The p-doped region may be a region doped with boron (B), while the n-doped region may be a region doped with phosphorus (P) or arsenic (As).

The optical device 100 may further include a first electrode or electrical contact electrically coupled to the p-doped region and a second electrode or electrical contact electrically coupled to the n-doped region. The first electrode may be arranged on the p-doped region and the second electrode may be arranged on the n-doped region. The first electrode may be in contact with the p-doped region and the second electrode may be in contact with the n-doped region.

The semiconductor layer 104 may further include a pair of stressing pads (or stressing elements) extended from opposite end regions (or ends) of the beam structure 106. Each stressing pad of the pair of stressing pads may have a larger dimension compared to the beam structure 106. For example, the width of each stressing pad may be larger than the width of the beam structure 106.

The pair of stressing pads may generate or enhance the tensile strain experienced by the beam structure 106. For example, during and/or after fabrication, the pair of stressing pads may shrink or reduce in dimension or size, which induces a pulling effect on the beam structure 106, thereby generating or increasing the tensile strain acting on the beam structure 106. The amount of the tensile strain may be tuned by varying the dimension of each stressing pad.

A respective DBR of the pair of DBRs may be defined on a respective stressing pad of the pair of stressing pads.

In the context of various embodiments, each stressing pad of the pair of stressing pads may have a pad length of between about 1 µm and about 1000 µm, for example, between about 1 µm and about 500 µm, between about 1 µm and about 300 µm, between about 1 µm and about 100 µm, between about 1 µm and about 50 µm, between about 100 µm and about 1000 µm, between about 500 µm and about 1000 µm, between about 100 µm and about 500 µm, between about 100 µm and about 200 µm, or between about 200 µm and about 400 µm.

In the context of various embodiments, each stressing pad of the pair of stressing pads may have a pad width of between about 1 µm and about 1000 µm, for example, between about 1 µm and about 500 µm, between about 1 µm and about 300 µm, between about 1 µm and about 100 µm, between about 1 µm and about 50 µm, between about 100 µm and about 1000 µm, between about 500 µm and about 1000 µm, between about 100 µm and about 500 µm, between about 100 µm and about 200 µm, or between about 200 µm and about 400 µm.

In the context of various embodiments, each stressing pad of the pair of stressing pads may have a pad thickness of between about 10 nm and about 2000 nm, for example, between about 10 nm and about 1000 nm, between about 10 nm and about 500 nm, between about 10 nm and about 100 nm, between about 100 nm and about 2000 nm, between about 500 nm and about 2000 nm, between about 1000 nm and about 2000 nm, between about 500 nm and about 1000 nm, between about 1000 nm and about 2000 nm, between about 100 nm and about 1000 nm, or between about 100 nm and about 500 nm.

The p-doped region of the p-i-n junction may include one stressing pad of the pair of stressing pads, and the n-doped region of the p-i-n junction may include another stressing pad of the pair of stressing pads. In other words, one stressing pad may be formed or defined in the p-doped region, while another stressing pad may be formed or defined in the n-doped region.

In various embodiments, the beam structure 106 may be suspended over the substrate 102. This means that the beam structure 106 may be spaced apart from the substrate 102 by an air gap therebetween. The beam structure 106 may be fully or entirely suspended over the substrate 102. Being in a suspension state may allow the beam structure 106 to be subjected to a tensile strain that is larger compared to embodiments where the beam structure 106 is not suspended over the substrate 102. The beam structure 106 may define a bridge structure. The beam structure 106 may be in the form of a microbridge (µBridge).

In various embodiments, at least part of the beam structure 106 may be in contact with the substrate 102. Such an arrangement may allow for a more efficient thermal conduction between the beam structure 106 and the substrate 102.

In the context of various embodiments, the semiconductor layer 104 may include any suitable material that has an intrinsic tensile strain.

In various embodiments, the semiconductor layer 104 may include a germanium-based material. As non-limiting examples, the semiconductor layer 104 may include (elemental) germanium (Ge), or GeSn (germanium-tin), or SiGe (silicon-germanium). For a semiconductor layer 104 having GeSn, the Sn content may be between about 1 at % and about 30 at %.

In various embodiments, the semiconductor layer 104 may include a non germanium-based material. As non-limiting examples, the semiconductor layer 104 may include GaAs (gallium arsenide), or InP (indium phosphide), or InGaAs (indium gallium arsenide).

In various embodiments, the substrate 102 may include or may be a silicon (Si) substrate or a silicon-on-insulator (SOI) substrate.

In various embodiments, the optical device 100 may include or may be an optical (light) source. The optical source may be a laser, where the optical device 100 may include an optical cavity. Light may be scattered and collected from the surface of the semiconductor layer 104 or the optical device 100. Light may be amplified within the optical cavity or between the pair of DBRs. Some of the light may be outputted through or out of at least one DBR and optically coupled to a waveguide. It should be appreciated that the optical device 100 may be used for other applications, including but not limited to, optical modulators and photodetectors, e.g., based on the quantum confined Stark effect (QCSE), where an optical cavity may be optional. Further, while having a p-i-n junction allows for the optical device 100 (e.g., as a laser) to be electrically pumped, it should be appreciated that the optical device 100, as a modulator or a photodetector, may or may not require a p-i-n junction. As may be appreciated, some types modulators and detectors may not require p-i-n junctions, e.g., metal-semiconductor metal (MSM) detectors.

Figure 1B:
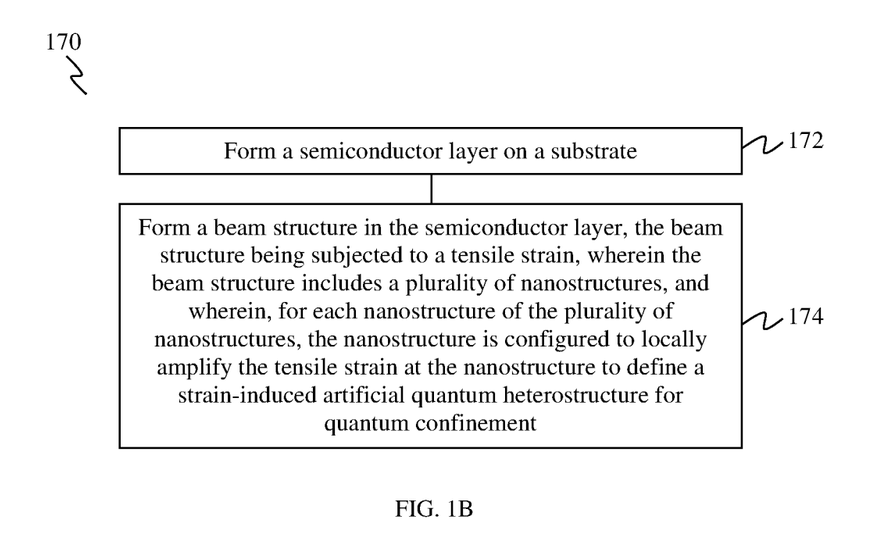
FIG. 1B shows a flow chart illustrating a method of forming an optical device, according to various embodiments.

FIG. 1B shows a flow chart 170 illustrating a method of forming an optical device, according to various embodiments.

At 172, a semiconductor layer is formed on a substrate.

At 174, a beam structure is formed in the semiconductor layer, the beam structure being subjected to a tensile strain. The beam structure includes a plurality of nanostructures, and wherein, for each nanostructure of the plurality of nanostructures, the nanostructure is configured to locally amplify the tensile strain at the nanostructure to define a strain-induced artificial quantum heterostructure for quantum confinement.

At 174, the method includes forming or defining the plurality of nanostructures on or in the beam structure.

A period of the plurality of nanostructures may be between about 50 nm and about 150 nm.

A number of the plurality of nanostructures may be between 1 and 1000.

Each nanostructure of the plurality of nanostructures may be or may include a nanohole. Each nanohole may have a diameter of about 50 nm or less.

The method may further include optically coupling an optical cavity to the beam structure. This may include forming a pair of distributed Bragg reflectors (DBRs) to define the optical cavity, the beam structure being arranged between the pair of DBRs.

At 172, a p-i-n junction may be formed in the semiconductor layer, the p-i-n junction having a p-doped region, an intrinsic region and an n-doped region, wherein the intrinsic region includes the beam structure.

At 172, a pair of stressing pads may be formed extended from opposite end regions of the beam structure.

The p-doped region may include one stressing pad of the pair of stressing pads, and the n-doped region may include another stressing pad of the pair of stressing pads.

The method may further include removing part of the substrate for the beam structure to be suspended over the substrate.

In various embodiments, at least part of the beam structure may be in contact with the substrate.

It should be appreciated that description in the context of the optical device 100 may correspondingly be applicable in relation to the method of forming an optical device described in the context of the flow chart 170.

Various embodiments will now be further described by way of the following non-limiting examples of an electrically-pumped germanium (Ge) laser, and with reference to FIGS. 2A to 5B.

Figures 2A, 2B:
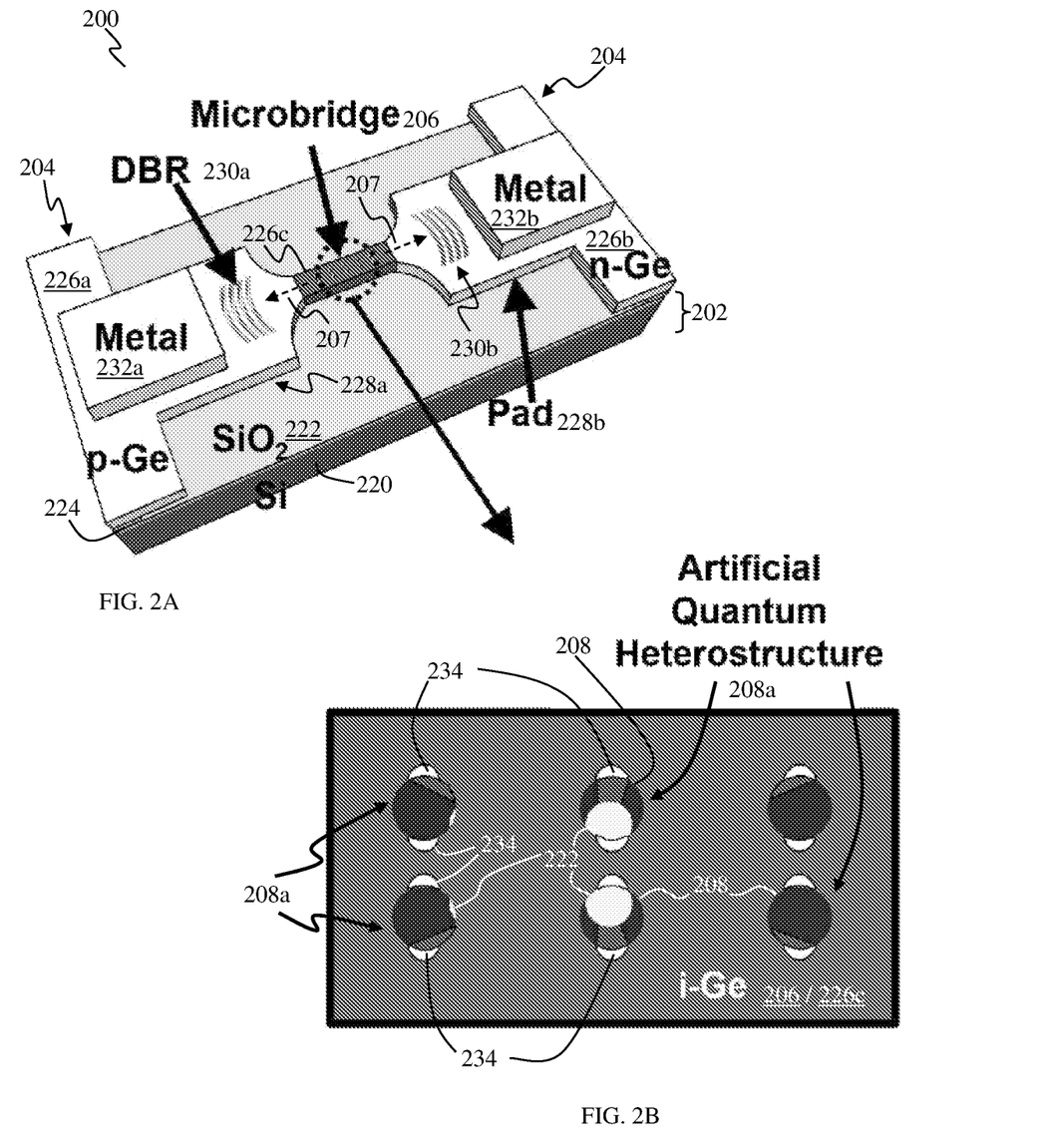

An electrically-driven germanium nanolaser 200 with artificial low-dimensional gain media is shown in FIGS. 2A and 2B. The laser 200 includes a substrate 202 having a silicon (Si) wafer or layer 220, a silicon dioxide ($SiO_2$) layer 222, and an aluminium oxide ($Al_2O_3$) layer 224 where part thereof has been removed during fabrication of the laser 200. The laser 200 includes a semiconductor layer 204, in the form of a Ge layer 204, which has been processed into a defined shape. The Ge layer 204 includes a p-doped region (p-Ge) 226a, an n-doped region (n-Ge) 226b, and an intrinsic region (i-Ge) 226c to define a lateral p-i-n junction. The p-i-n junction allows for electrical injection of carriers. The p-i-n junction may be employed for delivering electrons and holes from p-Ge 226a, n-Ge 226b to the central gain medium (i.e., i-Ge 226c). The p-Ge 226a allows holes to be injected and the n-Ge 226b allows electrons to be injected into the active intrinsic gain medium, i.e., i-Ge 226c. The p-i-n junction, having p-Ge 226a, n-Ge 226b, and i-Ge 226c, may be created by ion implantation. In further embodiments, the semiconductor layer 204 may be a GeSn layer. The Sn content for GeSn may be 1 at %-30 at %.

A beam structure 206, in the form of a microbridge structure 206, may be defined in i-Ge 226c. The length of the microbridge 206 may be 0.5 μm-50 μm. The width of the microbridge 206 may be 0.05 μm-2 μm. Suitable thickness for the microbridge 206 may be as determined by the thickness of the Ge layer 204.

A pair of stressing pads 228a, 228b may be defined in p-Ge 226a and n-Ge 226b respectively, extending from opposite end regions of the microbridge 206. The length of each pad 228a, 228b may be 1 μm-1000 μm. The width of each pad 228a, 228b may be 1 μm-1000 μm. The thickness of each pad 228a, 228b may be 10 nm-2000 nm.

Part of the $Al_2O_3$ layer 224, including the portion underneath the microbridge 206, may be removed such that the microbridge 206 is suspended over the substrate 202, with an air gap therebetween. Part of the stressing pads 228a, 228b may also be suspended over the substrate 202. Part of the $Al_2O_3$ layer 224 may remain underneath p-Ge 226a and n-Ge 226b. The microbridge 206 is tensile strained. The tensile strain (represented by dashed arrows 207) in the microbridge 206 may be induced by geometrical strain amplification. The two pads 228a, 228b may play a role of stretching the central microbridge 206 to the side. The tensile strain 207 is uniaxial. The tensile strain 207 in the microbridge 206 may be tuned. As non-limiting examples, one or more of the following may be employed to change the tensile strain 207: (i) increasing (or decreasing) the length of one or more pads 228a, 228b causes an increase (or decrease) in the strain 207, (ii) increasing (or decreasing) the width of one or more pads 228a, 228b causes an increase (or decrease) in the strain 207, (iii) increasing (or decreasing) the width of the microbridge 206 causes a decrease (or increase) in the strain 207, and (iv) increasing (or decreasing) the length of the microbridge 206 causes a decrease (or increase) in the strain 207.

A plurality of nanostructures, in the form of nanoholes 208, are defined in the microbridge 206. While six nanoholes 208 are shown in FIG. 2B, it should be appreciated that a lower or higher number of nanoholes 208 may be defined in the microbridge 206. As shown in FIG. 2B, part of the $SiO_2$ layer 222 (shown as white regions inside the nanoholes 208), after removal of the Al₂O₃ layer 224 beneath the microbridge 206, may be observed.

Suitable shapes for the nanoholes 208 may include, but not limited to, square, diamond and circle. The dimensions of each nanohole 208 may vary between 1 nm and 100 nm. The depth of each nanohole 208 may be the same as the thickness of the Ge layer 204 (e.g., the nanoholes 208 are etched all the way through the thickness).

The application of tensile strain 207 allows the strain 207 to accumulate around the nanoholes 208 to introduce nanoscale strain gradients which introduce quantum confinement. The presence of the nanoholes 208 in the microbridge 206 may localise weakly distributed tensile strain 207 in the microbridge 206 into the above and below regions of the nanoholes 208 (the localised strain being shown as white regions 234 outside the nanoholes 208 in FIG. 2B), e.g., the strain may be localised and concentrated at the top and bottom surfaces of the Ge layer 204. This may mean that the tensile strain 207 in the microbridge 206 is amplified, by the nanoholes 208, locally at the nanoholes 208 or at one or more localised regions 234 of each nanohole 208. While not shown, it should be appreciated that each local region 234 of concentrated strain extends throughout the Ge layer 204 or i-Ge 226c to define a localised volume 234 of concentrated strain. As shown in FIG. 2B, strain may be concentrated or amplified at the local regions or volumes 234 on opposite sides of each nanohole 208, resulting in a strain gradient across each side of the nanohole 208, and such a strain concentration effect results in an artificial quantum heterostructure 208a being defined. In this way, a nanohole 208, with localised strain concentration or amplification, may result in at least one artificial quantum heterostructure 208a. While the strain concentration effect caused by geometric discontinuities is a problem in the field of mechanics because the increased stress in a local area gives rise to cracks and fractures in mechanical structures, the techniques disclosed herein carefully manage the strain level below the fracture limit of the semiconductor layer 204, e.g., below the fracture limit of Ge or GeSn crystal, so as to employ the strain concentration effect to obtain low-dimensional tensile-strained Ge and GeSn gain media to realise electrically-pumped Ge and GeSn lasers. The p-i-n junction defined in the laser 200 allows carriers to recombine in the active gain medium (i.e., i-Ge 226c) where the artificial quantum heterostructures 208a are. As there are challenges in generating laser light on a silicon chip from electricity and in pumping light into silicon chips to operate the laser, electrically pumped operation may be used in various embodiments. Further, the laser may be driven by electrical circuits for all applications.

In various embodiments, low-dimensional quantum heterostructures are created only by highly localised tensile strain, thus removing the necessity of the complicated heteroepitaxy approach used in known methods.

The laser 200 may further include a pair of distributed Bragg reflectors (DBRs) 230a, 230b to define an optical cavity optically coupled to the microbridge 206. The pair of DBRs 230a, 230b are arranged on opposte ends of the microbridge 206, sandwiching the microbridge 206. A first DBR 230a is defined in a first stressing pad 228a in p-Ge 226a, while a second DBR 230b is defined in a second stressing pad 228b in n-Ge 226b. The two DBRs in the pads 228a, 228b may act to confine light or the associated optical field within the entire microbridge 206 or the laser 200. Each DBR 230a, 230b may be defined by a plurality of air trenches, for example, 8-12 trenches. The width of each trench may be 50 nm-300 nm. The periodicity of the trenches may be 200 nm-400 nm.

The laser 200 may further include a pair of electrodes 232a, 232b, in the form of metal contacts. A first metal contact 232a is electrically coupled to p-Ge 226a. The first metal contact 232a may be arranged on p-Ge 226a, in contact with p-Ge 226a. A second metal contact 232b is electrically coupled to n-Ge 226b. The second metal contact 232b may be arranged on n-Ge 226b, in contact with n-Ge 226b. An electrical signal may be applied to the metal contacts 232a, 232b.

While the laser 200 has been described with a Ge layer 204, it should be appreciated that any suitable material or material composition may be employed for the semiconductor layer 204, as long as the material has an intrinsic tensile strain and is releasable (e.g., by undercutting the Al₂O₃ layer 224 in the non-limiting examples described herein). Therefore, a wide variety of materials may be used, including but not limited to, Ge-based materials (e.g., Ge, GeSn and SiGe), and non-Ge based materials (e.g., GaAs, InP, InGaAs). However, it should be appreciated that applications and fabrication processes may be different.

During operation, CMOS electronic driver circuits may be provided to apply a current to the laser 200 to convert the electrical signals into optical signals by reaching threshold and producing light. Electrical signals may be applied to the electrodes 232a, 232b. Carriers are then injected from p-Ge 226a and n-Ge 226b to i-Ge 226c to recombine therein. Light is then generated from i-Ge 226c and outputted by the laser 200. The light may then be coupled into photonic circuits (e.g., waveguides and modulators) and may eventually be converted back into an electrical signal by a photodetector. In greater detail, as a non-limiting example, light may be generated in the artificial quantum heterostructures 208a. The DBRs (or mirrors) 230a, 230b trap the light. The light may then be amplified via stimulated emission. The light may subsequently be coupled out from one of the DBRs (or mirrors) 230a, 230b into a waveguide, for example, in a stressing pad 228a, 228b.

FIGS. 3A to 3D show, as perspective views, various processing stages of a fabrication process flow, according to various embodiments.

Figure 3A:
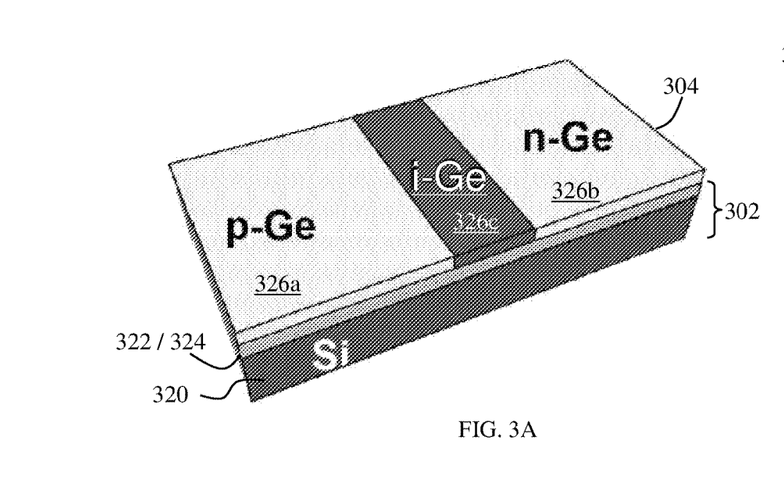
FIGS. 3A to 3D show, as perspective views, various processing stages of a fabrication process flow for manufacturing the laser of FIG. 2A.

Referring to FIG. 3A, the process starts with a substrate 302 with a Si layer 320, a SiO₂ layer 322 on the Si layer 320, and an Al₂O₃ layer 324 on the SiO₂ layer 322, and a (elemental) Ge layer 304 on the substrate 302. Ion implantations may be carried out to define p-, i-, and n-type germanium regions, i.e., p-Ge 326a, n-Ge 326b, and i-Ge 326c. Dopants that may be employed include boron (B) for p-Ge 326a, and phosphorous (P) or arsenic (As) for n-Ge 326b. When using GeSn instead of elemental Ge for the semiconductor layer, the same process steps may be used to create p-, i- and n-type GeSn regions.

Figure 3B:
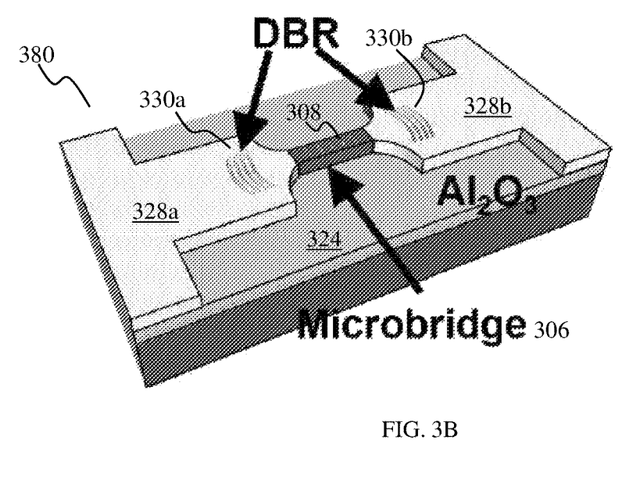

Referring to FIG. 3B, a lithography process may be carried out to define a Ge laser structure 380 with artificial heterostructures and DBRs. Part of the Al₂O₃ layer 324 is exposed after the process. The structure 380 includes a beam structure or a microbridge 306 defined in i-Ge 326c. Nanoholes 308 are defined or etched in the microbridge 306 to define artificial heterostructures. Stressing pads 328a, 328b are defined, in p-Ge 326a and n-Ge 326b, extending from the microbridge 306. A first DBR 330a is defined in the pad 328a and a second DBR 330b is defined in the pad 328b.

Figure 3C:
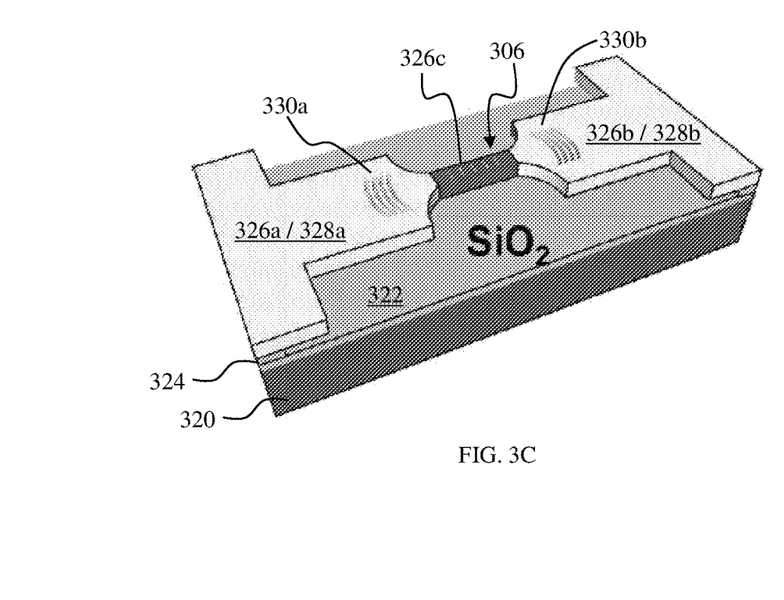

Referring to FIG. 3C, a selective undercut of the Al₂O₃ layer 324 is carried out to induce large tensile strain near the nanoholes 308. The Al₂O₃ layer 324 underneath the microbridge 306 and the pads 328a, 328b are removed to introduce or enhance the tensile strain acting on the microbridge 306. Part of the SiO$_2$ layer 322 is therefore exposed. Part of the Al$_2$O$_3$ layer 324 may remain towards the end regions of p-Ge 326a and n-Ge 326b. Depending on the fabrication process, the microbridge 306 and the pads 328a, 328b may either be suspended over the substrate 302 (i.e., a suspended state), with an air gap therebetween, or may be in contact with the underlying SiO$_2$ layer 322 (i.e., a stuck state) (see, for example, FIG. 6 to be described below). For example, at least part of the microbridge 306 may drop through the air gap to contact the SiO$_2$ layer 322. The suspended state may be achieved by using critical point drying (CPD) or vapour based etching. The stuck state may be achieved by liquid based etching and drying.

Figure 3D:
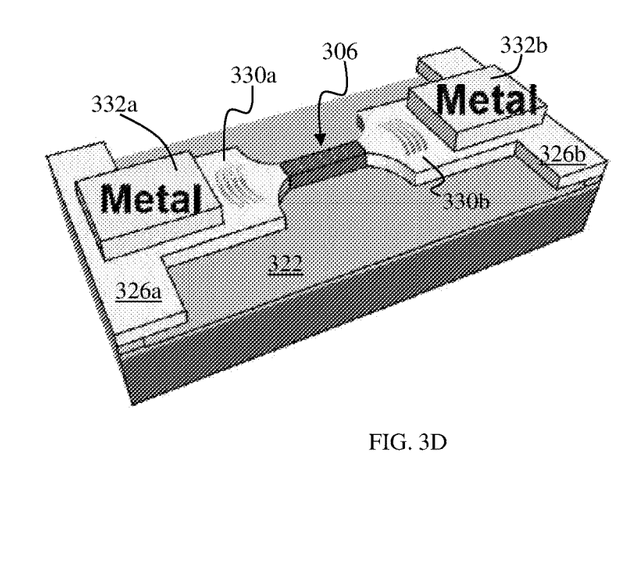

Metal contact deposition may then be performed. As shown in FIG. 3D, a first metal contact 332a may be provided on p-Ge 326a, and a second metal contact 332b may be provided on n-Ge 326b.

In greater detail, the fabrication process may start with a germanium-on-insulator (GOI) substrate formed by direct wafer bonding processes. For example, a silicon (Si) carrier wafer having a germanium (Ge) layer 304, and an aluminum oxide (Al$_2$O$_3$) layer 324 on the Ge layer 304 may be bonded to a handle Si wafer 320 having a silicon dioxide (SiO$_2$) layer 322. Direct bonding may be utilised by bringing the Al$_2$O$_3$ layer 324 and the SiO$_2$ layer 322 into contact at room temperature. The Si carrier wafer may then be removed, allowing the formation of a GOI wafer having the handle Si wafer 320 with the SiO$_2$ layer 322, the Al$_2$O$_3$ layer 324, and the Ge layer 304. The Ge layer 304 may be grown on the Si carrier wafer, and, during the growth process, corresponding dopants may be introduced to the Ge layer 304 to define a p-doped Ge region 326a and an n-doped Ge region 326b. It should be appreciated that a GeSn layer may be grown on the Si carrier wafer instead of the Ge layer 304.

The fabrication process may then proceed to spin coating of an electronic resist (e.g., poly(methyl methacrylate)), followed by electron beam lithography (EBL) to define the beam or bridge structure 306 and nano-holes 308 followed by development in a suitable developer solution. The stressing pads 328a, 328b may also be defined. Anisotropic dry etching using reactive ion etching (RIE) with a suitable gas chemistry (e.g., chlorine) may then be performed to transfer the pattern by etching down to the Al$_2$O$_3$ layer 324. Subsequently, selective wet etching may be carried out to undercut the Al$_2$O$_3$ layer 324 and introduce the tensile strain. The wet etchant used may be either potassium hydroxide (KOH) or tetramethylammonium hydroxide (TMAH). In various embodiments, vapour hydrofluoric acid (HF) may be used to etch both the Al$_2$O$_3$ layer 324 and the SiO$_2$ layer 322 to enable the beam structure 306 to be suspended.

Figure 4A:
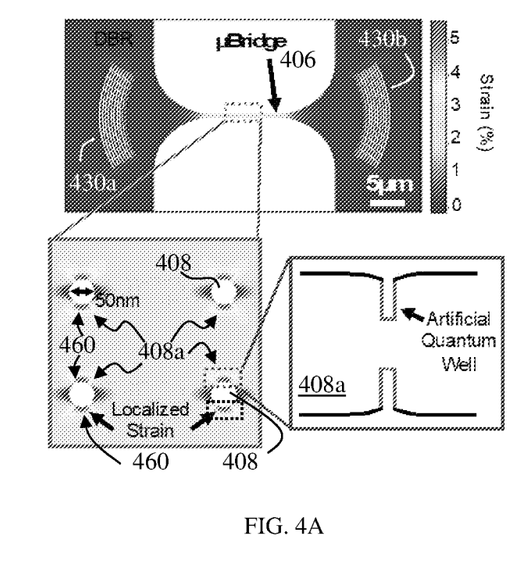
FIG. 4A shows FEM (finite element method) simulations showing artificial quantum heterostructures enabled by a high, localised strain.
Figure 4B:
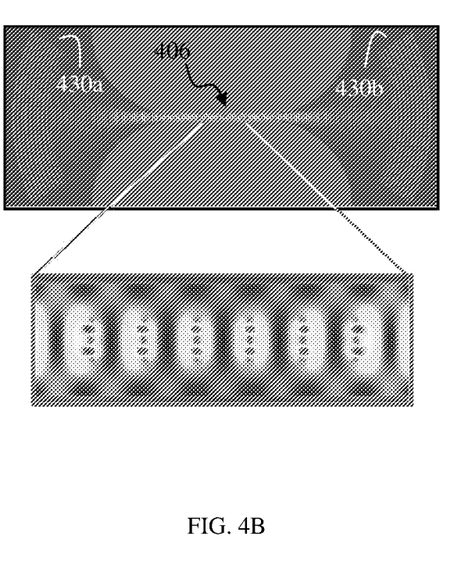
FIG. 4B shows FDTD (finite-difference time-domain) simulations showing a highly confined optical field with a quality factor of ~10,000.

Mechanical and optical simulations have been performed by using finite-element method (FEM) and finite-difference time-domain (FDTD) simulations, respectively, where the results are shown in FIGS. 4A and 4B. The structure of various embodiments has a microbridge with nanoholes of <50 nm diameters. The full-width half-maximum (FWHM) of the highly strained regions at the above and below regions of the nanoholes is ~10 nm which may create potential wells at the quantum regime. The shape of the nanoholes may be circles, but may be varied to other shapes (e.g., diamond shape with sharper corners) to induce even narrower quantum wells. The periodicity and the number of quantum wells may be tailored by simple lithography. 20 quantum wells may be sufficient for a large net gain (as will be described below) with a periodicity of 50 nm-150 nm.

The design shown in FIG. 4A has a microbridge (μBridge) 406 with 20 quantum wells 408a, corresponding to 10 nanoholes 408, arranged between a pair of distributed Bragg reflectors (DBRs) 430a, 430b. As may be observed, there is localised strain at each nanohole 408, at local regions or volumes 460 of the nanohole 408 on opposite sides of the nanohole 408. The respective strain gradient on each side of the nanohole 408 (please refer to dotted boxes in FIG. 4A), caused by the enhanced localised strain at the respective local region 460, gives rise to an artificial quantum heterostructure 408a, in the form of an artificial quantum well 408a. Accordingly, the localised amplified strain of each local region or volume 460 gives rise to an artificial quantum well 408a, which may result in two artificial quantum wells 408a for the nanohole 408, on opposite sides of the nanohole 408. The strain gradient on each side of the nanohole 408, at each local region or volume 460, extends continuously throughout the thickness of the microbridge (μBridge) 406 or the corresponding semiconductor layer. The enhanced localised strain at the local region 460 results in a region of lower or narrower bandgap compared to neighbouring regions of lower strain and thus, larger bandgap.

FIG. 4B shows the optical field patterns in the structure. The photons emitted from the artificial quantum wells 408a may be bounced back by the two DBRs 430a, 430b, amplifying the optical field intensity by stimulated emission. Despite the presence of nanoholes 408 which may act as optical scatterers, the quality factor of the simulated optical field is ~10,000 because of a much larger wavelength of the emitted photons (>1500 nm, effective wavelength is >1500 nm/n where n~4 which is the refractive index of Ge) compared to the sub-100 nm holes.

Figure 4C:
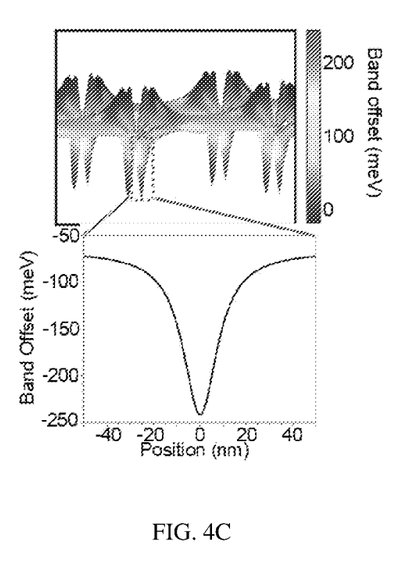
FIG. 4C shows the estimated band edge diagram for the conduction band.

FIG. 4C shows the estimated band edge diagram for the conduction band that is directly mapped from the strain distribution in FIG. 4A. The 2D strain profile allows computation of the bandgap energies at different locations from the Ge's deformation potentials. Although the band offsets for electrons and holes are different due to different deformation potentials, the two bands (conduction and valence bands) bend strongly towards charge neutrality in an intrinsic germanium layer, and therefore, the conduction and valence band offsets may be assumed to be almost equal after band bending. This analysis shows the depth and the width of the artificial potential wells are >150 meV and <50 nm, respectively, thus enabling a strong room-temperature quantum confinement of electrons which have a small thermal energy of 26 meV at room temperature.

Figure 5A:
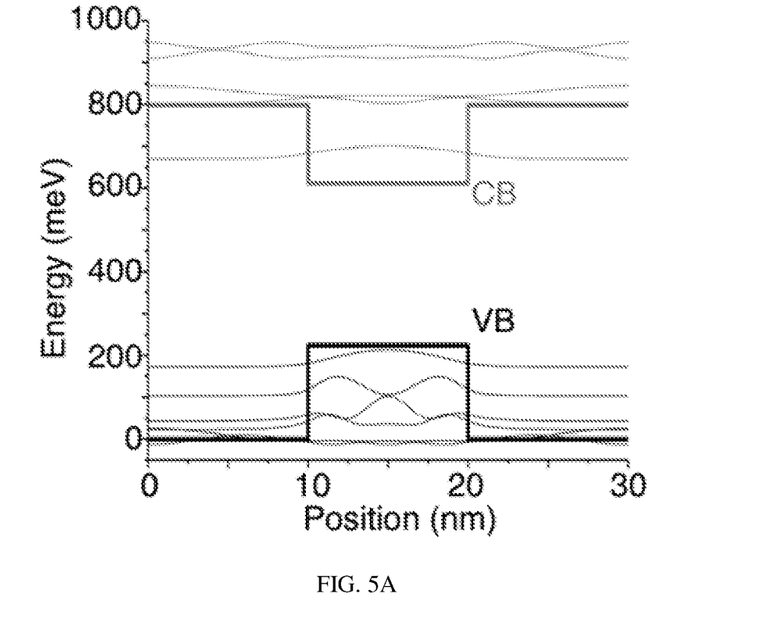
FIG. 5A shows the band lineup and squared wavefunction of artificial germanium quantum wells with a well width of 10 nm.
Figure 5B:
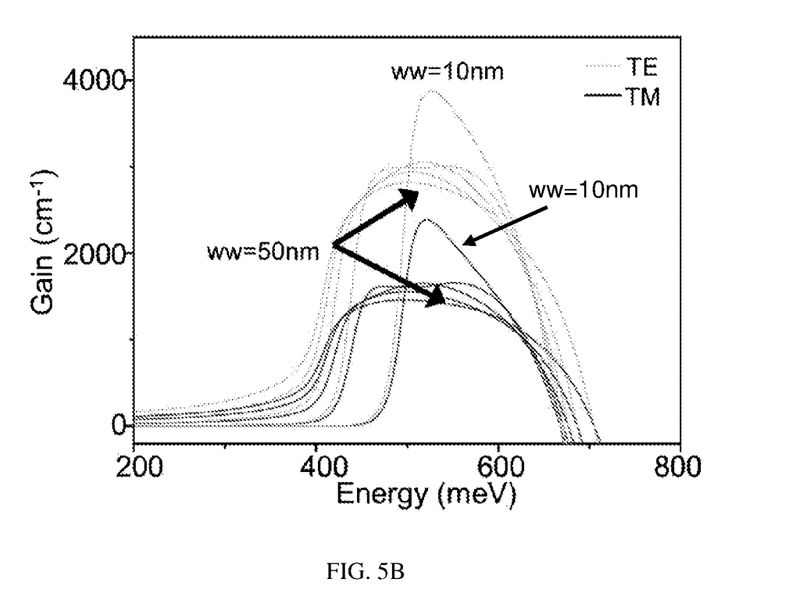
FIG. 5B shows the optical gain curves of artificial germanium quantum wells with different well widths (ww) with an injection carrier concentration of $4 \times 18/cm^3$.

The techniques disclosed herein may enable nanoscale (<10 nm) quantum wells with a well depth of ~200 meV, which, based on theoretical simulations carried out, may induce significant quantisation between energy levels (e.g., >50 meV quantisation between two lowest energy states) (please refer to FIG. 5A showing the band lineup and squared wavefunction of artificial germanium quantum wells with a well width of 10 nm). FIG. 5A shows the band energies as a function of position across the artificial heterostructure. The results show that the confinement is ~10 nm in distance which is suitable for quantum confinement. The results also show the confinement energy of roughly 200 meV in the conduction band (CB) and the valence band (VB). A substantial enhancement of optical gain in Ge artificial quantum heterostructures may be expected (please refer to FIG. 5B showing the optical gain curves of artificial germanium quantum wells with different well widths with an injection carrier concentration of $4 \times 18/cm^3$), which may allow the performance of Ge and GeSn lasers to be pushed to or close(r) to the limit. FIG. 5B shows the net optical gain for artificial quantum heterostructures with 10 nm and 50 nm length. This shows a large positive net gain which is ideal or preferable for efficient lasing.

Figure 6:
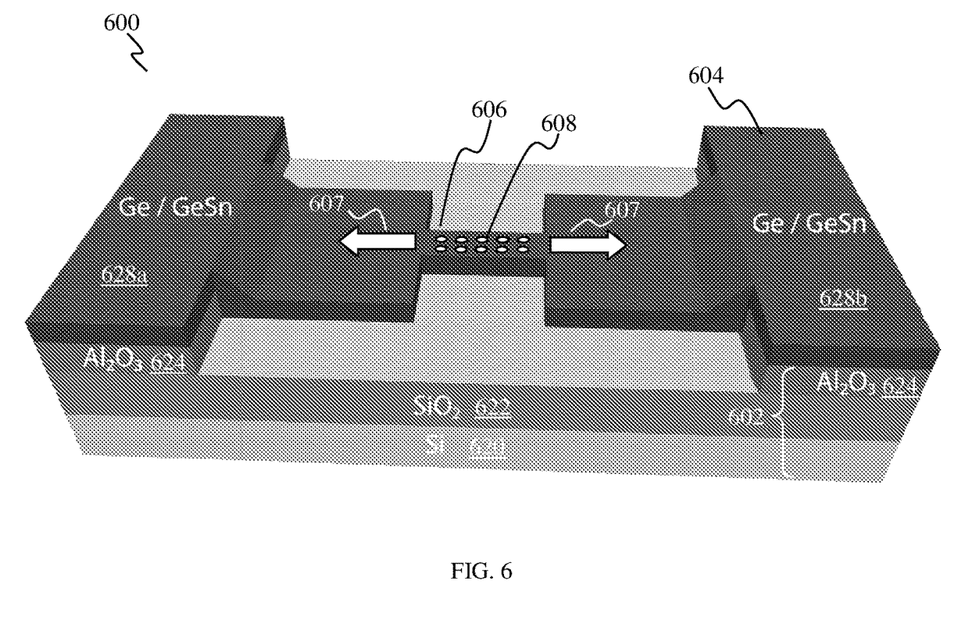
FIG. 6 shows a schematic view of an optical device, according to various embodiments.

FIG. 6 shows a schematic view of an optical device 600, according to various embodiments. The optical device 600 includes a substrate 602 having a silicon (Si) wafer or layer 620, a silicon dioxide ($SiO_2$) layer 622, and an aluminium oxide ($Al_2O_3$) layer 624 where part thereof has been removed during fabrication of the optical device 600. The optical device 600 includes a semiconductor layer 604, e.g., in the form of a Ge or GeSn layer 604, which has been processed into a defined shape to define a beam structure 606 and a pair of stressing pads 628a, 628b extending from opposite end regions of the beam structure 606. A plurality of nanostructures 608, e.g., in the form of nanoholes, are defined in the beam structure 606. While ten nanostructures 608 are shown in FIG. 6, it should be appreciated that a lower or higher number of nanostructures 608 may be defined in the beam structure 606. The beam structure 606, with the nanostructures 608, are under a tensile strain (represented by white arrows 607). Rather than being suspended over the substrate 602, the beam structure 606 and parts of the stressing pads 628a, 628b are in contact with the $SiO_2$ layer 622 or the substrate 602, i.e., in a stuck state.

It should be appreciated that description in the context of the nanolaser 200 of FIGS. 2A and 2B may be applicable to the optical device 600. As a non-limiting example, the semiconductor layer 604 may be processed to define a p-i-n junction, with the beam structure 606 being defined in the intrinsic region of the p-i-n junction. As a further non-limiting example, a pair of electrodes may be provided in the optical device 600, respectively electrically coupled to the p-doped region and the n-doped region of the p-i-n junction. As a yet further non-limiting example, an optical cavity may be defined in the optical device 600, and the beam structure 606, with the nanostructures 608, may be arranged within and optically coupled to the optical cavity. The optical cavity may be defined by a pair of DBRs respectively defined in the stressing pads 628a, 628b.

The techniques disclosed herein may provide a route towards creating artificial low-dimensional quantum heterostructures in a single material (e.g., Ge, GeSn) by (only) leveraging spatially varying strain. The techniques may provide one or more low-threshold (as a result of tensile strain induced quantum confinement effect) electrically-pumped germanium quantum heterostructure lasers operating at room temperature that are technologically important for the realisation of photonic-integrated circuits.

Known quantum heterostructures rely on using two different materials with varying bandgaps to introduce quantum confinement. However, this requires complex epitaxial growth, limiting the practical applications in Ge. In the techniques disclosed herein, tensile strain gradients are employed to vary the bandgap in a single material or material composition to introduce quantum confinement. This effect is referred to as "quantum strain".

Compared to known methods, the techniques disclosed herein provide a specified fabrication technology to etch small holes in GeSn or Ge precisely. Various fabrication processes have been optimised. One of these involves the lithography process which includes optimisation of at least one of the resist thickness, exposure conditions and development time. Another aspect includes developing a suitable dry etching recipe to create vertical sidewalls and maintain the geometry of the holes whilst minimising surface roughness which can introduce optical losses.

Furthermore, it is challenging to measure the quantum confinement effects, for which an optical characterisation equipment has been developed to carry out such measurements in various embodiments. Further, the holes for quantum strain should not interfere with the optical mode for quantum strain laser devices, for which the holes have been carefully designed and developed. This includes careful optimisation of at least one of the hole diameter and the number of holes to maximise the optical Q-factor.

Various embodiments employ specifically size-optimised holes in the active strained region, allowing for an approach to generate quantum confinement effects by 'quantum strain' in semiconductor lasers. The active region is the intrinsic part of the beam structure or microbridge with the nanostructures (e.g., nanoholes) which is where (laser) light is generated. The optimum size of the holes may depend on the application and requirements. To introduce strong quantum confinement effects, the holes should be ~50 nm or less. Small holes are defined in the active strained medium, which introduces strain induced quantum heterostructures. This is in contrast to the view that it is generally considered counter-intuitive to introduce holes or slits into the active strained region as it will cause mechanical instability. As such, known approaches do not involve etching holes or slits into the active strained region, let alone create quantume strain, as achieved by the techniques disclosed herein.

Compared to known methods, in the techniques disclosed herein, a tensile strain may be applied to the beam structure or bridge upon undercutting part of or a layer of the substrate, e.g., the $Al_2O_3$ layer. This tensile strain accumulates and amplifies around the nanoholes with nano-scale dimensions to allow quantum strain induced confinement.

Integration of photonic devices, especially on-chip lasers, with electronics using highly mature CMOS (complementary metal-oxide-semiconductor) technology may add a significant value to the industry. The realisation of electrically-pumped on-chip nanolasers on Si would certainly bring a significant breakthrough in Si photonics and would be a perfect complement to existing industry. For example, integrated optical transceivers using Si photonics technology have emerged as a strong contender to replace bandwidth-hungry and energy-guzzling known electrical transceiver in data centers. Cost-effective mass production of optical transceivers, integrated LiDAR chips and ultra-compact mid-infrared sensors may create many unforeseen opportunities in the field of electronics, photonics, and biomedical engineering. Known technology relies on III-V materials which are not compatible with the industry standard silicon technology. Not only does this limit applications but it also drives costs up preventing these applications being achieved. On the other hand, the Ge based devices or lasers according to the techniques disclosed herein are compatible with standard silicon technology.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. An optical device comprising:
   a substrate;

a semiconductor layer on the substrate, the semiconductor layer comprising a beam structure that is subjected to a tensile strain, wherein the beam structure comprises a plurality of nanostructures, and wherein, for each nanostructure of the plurality of nanostructures, the nanostructure is configured to locally amplify the tensile strain at the nanostructure to define a strain-induced artificial quantum heterostructure for quantum confinement.

2. The optical device as claimed in claim 1, wherein each nanostructure of the plurality of nanostructures comprises a nanohole.

3. The optical device as claimed in claim 2, wherein each nanohole has a diameter of about 50 nm or less.

4. The optical device as claimed in claim 1, further comprising an optical cavity optically coupled to the beam structure.

5. The optical device as claimed in claim 4,
wherein the optical cavity is defined by a pair of distributed Bragg reflectors, and
wherein the beam structure is arranged between the pair of distributed Bragg reflectors.

6. The optical device as claimed in claim 1, wherein the semiconductor layer comprises a p-i-n junction comprising a p-doped region, an intrinsic region and an n-doped region, wherein the intrinsic region comprises the beam structure.

7. The optical device as claimed in claim 1, wherein the semiconductor layer further comprises a pair of stressing pads extended from opposite end regions of the beam structure.

8. The optical device as claimed in claim 1, wherein the semiconductor layer comprises a p-i-n junction comprising a p-doped region, an intrinsic region and an n-doped region, wherein the intrinsic region comprises the beam structure;
wherein the semiconductor layer further comprises a pair of stressing pads extended from opposite end regions of the beam structure; and
wherein the p-doped region comprises one stressing pad of the pair of stressing pads, and the n-doped region comprises another stressing pad of the pair of stressing pads.

9. The optical device as claimed in claim 1, wherein the beam structure is suspended over the substrate.

10. The optical device as claimed in claim 1, wherein at least part of the beam structure is in contact with the substrate.

11. A method of forming an optical device comprising:
forming a semiconductor layer on a substrate; and
forming a beam structure in the semiconductor layer, the beam structure being subjected to a tensile strain;

wherein the beam structure comprises a plurality of nanostructures, and wherein, for each nanostructure of the plurality of nanostructures, the nanostructure is configured to locally amplify the tensile strain at the nanostructure to define a strain-induced artificial quantum heterostructure for quantum confinement.

12. The method as claimed in claim 11, wherein each nanostructure of the plurality of nanostructures comprises a nanohole.

13. The method as claimed in claim 12, wherein each nanohole has a diameter of about 50 nm or less.

14. The method as claimed in claim 11, further comprising optically coupling an optical cavity to the beam structure.

15. The method as claimed in claim 14, wherein optically coupling the optical cavity to the beam structure comprises forming a pair of distributed Bragg reflectors to define the optical cavity, the beam structure being arranged between the pair of distributed Bragg reflectors.

16. The method as claimed in claim 11, wherein forming the semiconductor layer comprises forming a p-i-n junction in the semiconductor layer, the p-i-n junction comprising a p-doped region, an intrinsic region and an n-doped region, wherein the intrinsic region comprises the beam structure.

17. The method as claimed in claim 11, wherein forming the semiconductor layer further comprises forming a pair of stressing pads extended from opposite end regions of the beam structure.

18. The method as claimed in claim 11, wherein forming the semiconductor layer comprises forming a p-i-n junction in the semiconductor layer, the p-i-n junction comprising a p-doped region, an intrinsic region and an n-doped region, wherein the intrinsic region comprises the beam structure;
wherein forming the semiconductor layer further comprises forming a pair of stressing pads extended from opposite end regions of the beam structure; and
wherein the p-doped region comprises one stressing pad of the pair of stressing pads, and the n-doped region comprises another stressing pad of the pair of stressing pads.

19. The method as claimed in claim 11, further comprising removing part of the substrate for the beam structure to be suspended over the substrate.

20. The method as claimed in claim 11, wherein at least part of the beam structure is in contact with the substrate.

* * * * *